(12) United States Patent
Zwijze et al.

(10) Patent No.: US 9,134,384 B2
(45) Date of Patent: Sep. 15, 2015

(54) POSITION SENSOR

(71) Applicants: Albert Ferdinand Zwijze, Vriezenveen (NL); Paulus Thomas Johannes Gennissen, Enschede (NL); Michiel Boersma, Borne (NL); Jeroen Martinus, Zwolle (NL); Roger Appelo, Beilen (NL)

(72) Inventors: Albert Ferdinand Zwijze, Vriezenveen (NL); Paulus Thomas Johannes Gennissen, Enschede (NL); Michiel Boersma, Borne (NL); Jeroen Martinus, Zwolle (NL); Roger Appelo, Beilen (NL)

(73) Assignee: Sensata Technologies, Inc., Attleboro, MA (US)

( * ) Notice: Subject to any disclaimer, the term of this patent is extended or adjusted under 35 U.S.C. 154(b) by 273 days.

(21) Appl. No.: 13/865,294

(22) Filed: Apr. 18, 2013

(65) Prior Publication Data

US 2013/0285649 A1 Oct. 31, 2013

(30) Foreign Application Priority Data

Apr. 25, 2012 (EP) ..................................... 12165465
Apr. 4, 2013 (EP) ..................................... 13162275

(51) Int. Cl.
*G01R 33/02* (2006.01)
*G01D 5/14* (2006.01)

(52) U.S. Cl.
CPC ................ *G01R 33/02* (2013.01); *G01D 5/147* (2013.01)

(58) Field of Classification Search
CPC .... G01R 15/20; G01R 15/202; G01R 15/205; G01D 5/14; G01D 5/142; G01D 5/145; G01D 5/147; G01D 5/16; G01D 5/20; G01D 5/2006; G01D 5/2013; G01D 5/202; G01D 5/2026
USPC ............... 324/207.2, 207.11, 207.12, 207.13, 324/207.14, 207.21, 207.15, 207.16, 324/207.17, 207.18, 207.19, 207.24, 324/207.25, 207.26
See application file for complete search history.

(56) References Cited

U.S. PATENT DOCUMENTS

| 7,276,898 B2 * | 10/2007 | Rosplock ................... 324/207.2 |
| 2008/0224692 A1 * | 9/2008 | Baak .......................... 324/207.2 |
| 2009/0008583 A1 * | 1/2009 | Grethel ........................... 251/65 |

* cited by examiner

*Primary Examiner* — Arleen M Vazquez
*Assistant Examiner* — Robert P Alejnikov, Jr.
(74) *Attorney, Agent, or Firm* — Chapin IP Law, LLC

(57) ABSTRACT

Position sensor (10) for determining a linear position in a sensing direction, e.g. for application in a vacuum actuator. The position sensor (10) has a first sensor part and a second sensor part moveable with respect to each other. The first sensor part comprises an annular magnet (2) and a magnetic field sensor (3) positioned at a first distance ($1_1$) from the annular magnet on the magnet axis (1*a*). The second sensor part comprises a flux shaper (1) moveable through the annular magnet (2) along the sensing direction between a first and a second position, in the first position the flux shaper being substantially at the first distance ($1_1$) from the magnetic field sensor (3). The flux shaper is arranged to influence the magnetic field in a space between the annular magnet (2) and the magnetic field sensor (3).

17 Claims, 5 Drawing Sheets

POSITION SENSOR

FIELD OF THE INVENTION

The present invention relates to a position sensor for determining a linear position in a sensing direction, e.g. for measurement of a linear displacement of a moveable actuator element. More specifically, the present invention relates to a position sensor for determining a linear position in a sensing direction, comprising a first sensor part and a second sensor part moveable with respect to each other.

PRIOR ART

Prior art position sensors having sensor parts which are designed to have a very strict mutual positional relationship, usually suffer from a reduced useable lifespan due to internal mechanical friction and wear between the sensor parts. It is generally undesirable to replace or repair such position sensors in view of high associated costs, especially if such position sensors are used in complex products.

US patent publication U.S. Pat. No. 7,276,898 discloses a long stroke hall position sensor having a shaped pole. A housing is provided with a positioning member and a hall sensor. A shaped magnetic pole and a magnet are provided, and one of these is coupled to the positioning member. A hall effect sensor is provided and arranged to sense an intensity of the magnetic flux in the shaped magnetic pole. As a result, a sensor output is generated which varies with position of the positioning member. The geometry, dimensions and/or material of the shaped magnetic pole and the magnet can be adapted to tailor the output voltage versus position relationship.

SUMMARY OF THE INVENTION

The disclosure herein provides an accurate, reliable and low cost position sensor. The disclosure herein also provides a position sensor specifically suitable for use in turbochargers.

In one embodiment, a position sensor as defined above is provided, wherein the first sensor part includes an annular magnet with its magnet axis coinciding with the sensing direction and generating a magnetic field with a distribution axially symmetric along the sensing direction, and a magnetic field sensor positioned at a first distance from the annular magnet on the magnet axis, wherein the second sensor part includes a flux shaper moveable through the annular magnet along the sensing direction between a first and a second position, in the first position the flux shaper being substantially at the first distance from the magnetic field sensor, the flux shaper being arranged to influence the magnetic field in a space between the annular magnet and the magnetic field sensor.

This provides for a very reliable and easy to manufacture position sensor, as no friction exists between the mutually moving first and second part of the position sensor. Furthermore, the axial symmetry allows to cater for any possible misalignment or eccentric movement of an actuator element in connection with the second part of which the linear position is measured.

In a further aspect, an embodiment of the present invention relates to an actuator for providing a linear movement to an actuator element, e.g. a vacuum operated actuator for controlling vane positions in a turbo charger, including a position sensor according to any one of the present invention embodiments, wherein the second sensor part is connected to the actuator element.

SHORT DESCRIPTION OF DRAWINGS

The present invention will be discussed in more detail below, using a number of exemplary embodiments, with reference to the attached drawings, in which FIG. 1 shows a cross sectional view of a position sensor according to a first embodiment;

DETAILED DESCRIPTION OF EXEMPLARY EMBODIMENTS

Linear position sensors are widely used, e.g. also in combination with actuators, e.g. in automotive applications such as turbo chargers. Turbochargers increase the power output and fuel efficiency of various engine designs without increasing engine size and weight. Modern turbochargers are fitted with adjustable vanes inside the turbocharger, which are actuated using a single vacuum actuator.

Prior art position sensors used in turbochargers suffer from internal mechanical friction and wear between parts. The useable lifespan of these position sensors is normally increased by using expensive materials, such as PPS plastics with a high glass content (e.g. 40-45%), as these plastics reduce the effects of internal mechanical friction and wear between parts. Furthermore, these position sensors use a plurality of expensive magnets made from Neodymium to increase linearity and reliability, thereby increasing the number of components and manufacturing costs even more. Presently, linear position sensors are requested for e.g. automotive applications which provide a very high lifespan, and at the same time high accuracy, linearity, reliability and low cost.

The disclosure herein provides a reliable, accurate and low cost position sensor for use in e.g. turbochargers. The position sensor according to some embodiments has no internal friction as there is no mechanical contact between internal sensor parts. In addition, the position sensor as provided by further current invention embodiments eliminates the use of expensive magnets. Also, dimensional uncertainties with respect to manufacturing tolerances and temperature variations have no discernable effect on measurement accuracy and reliability of the position sensor.

Figure 1:
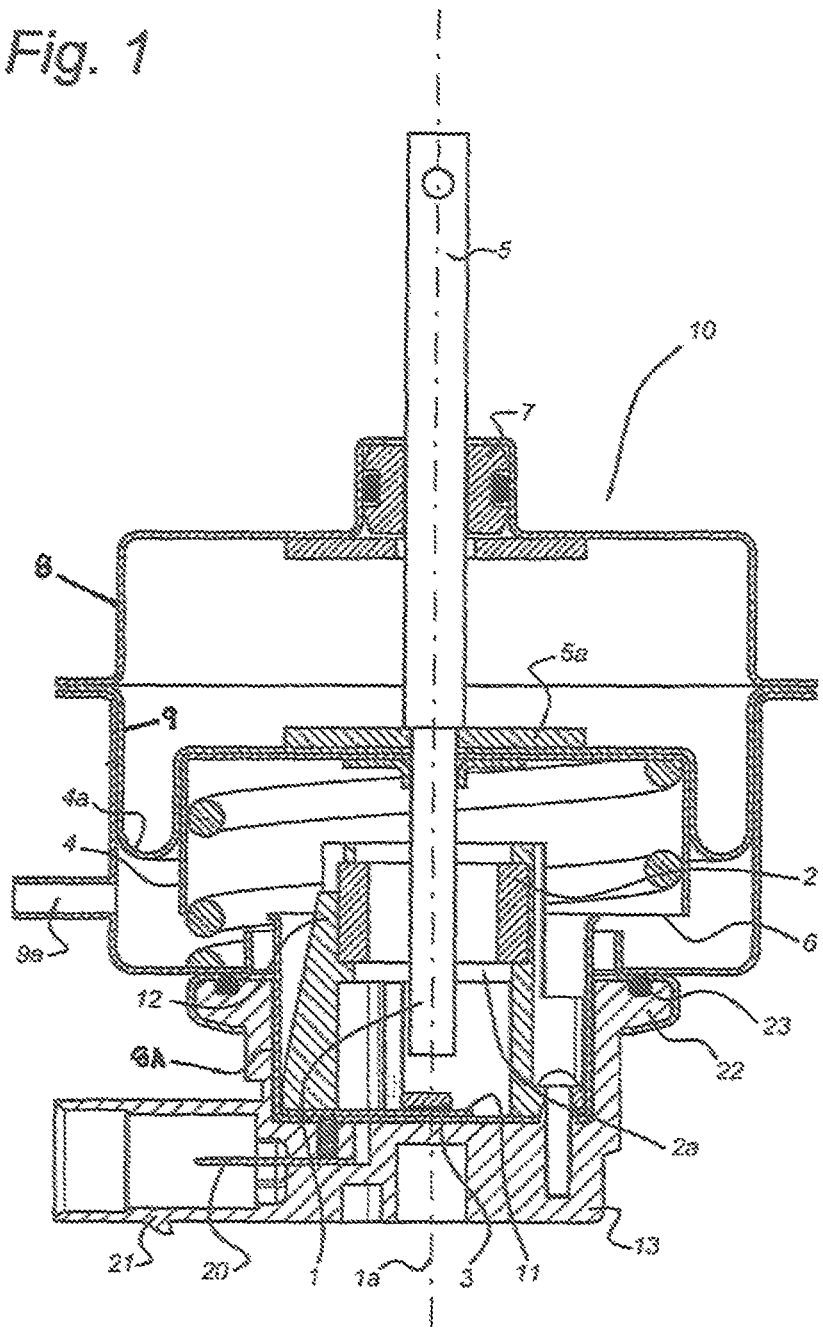
Figure 2:
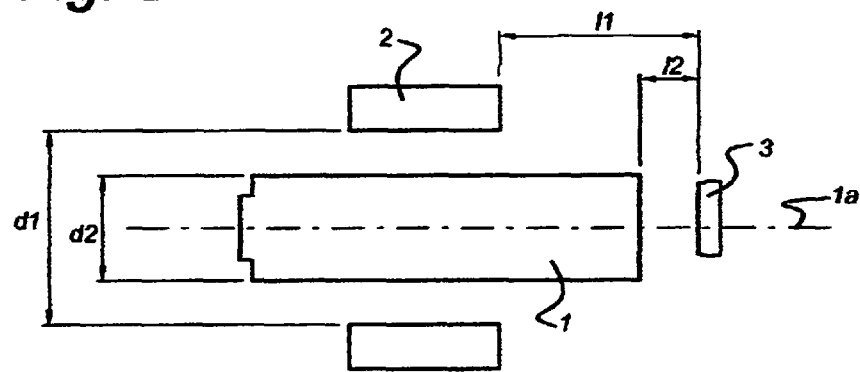
FIG. 2 shows a simplified diagram of the main elements of the position sensor and their mutual positioning.
Figure 3:
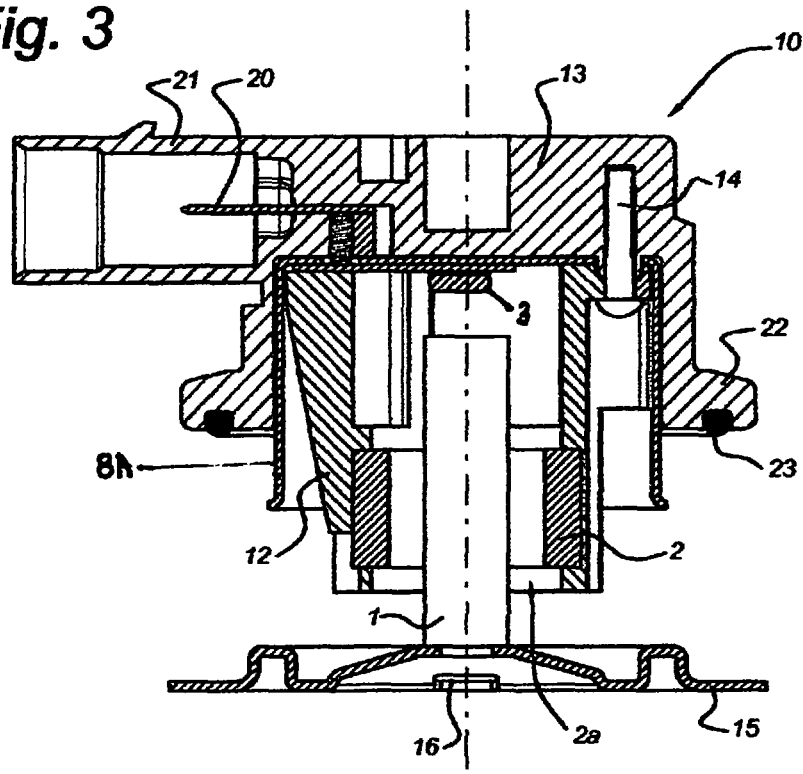
FIG. 3 shows a schematic view of a second embodiment of a position sensor.
Figure 4:
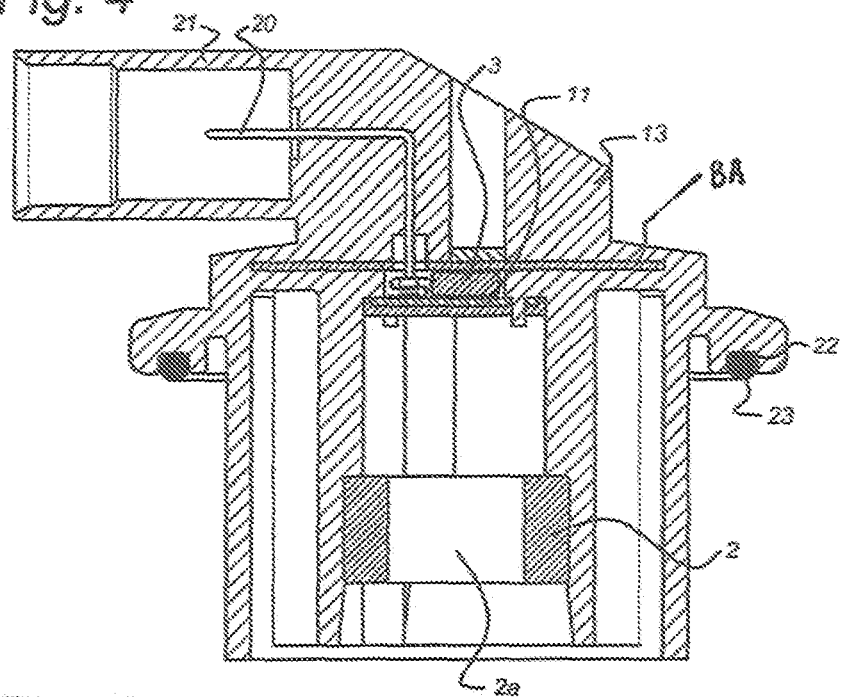
FIG. 4 shows a cross sectional view of a position sensor part according to a further embodiment.

In general terms, a position sensor for determining a linear position in a sensing direction is provided. In FIGS. 1, 3 and 4 cross sectional views are shown of embodiments of such a position sensor. FIG. 2 shows a simplified diagram for showing the mutual positioning of the main elements of the position sensor.

In an exemplary embodiment, the position sensor includes a first sensor part and a second sensor part moveable with respect to each other as shown schematically in FIG. 2. The first sensor part includes an annular magnet 2 with its magnet axis 1a coinciding with the sensing direction and generating a magnetic field with a distribution axially symmetric along the sensing direction, and a magnetic field sensor 3 positioned at a first distance $1_1$ from the annular magnet 2 on the magnet axis 1a. The second sensor part comprises a flux shaper 1 moveable through the annular magnet 2 along the sensing direction between a first and a second position, in the first position the flux shaper 1 being substantially at the first distance $1_1$ from the magnetic field sensor 3. The flux shaper 1 is arranged to influence the magnetic field in a space between the annular magnet 2 and the magnetic field sensor 3. E.g. the magnetic field lines are more concentrated when the flux shaper 1 is near to the magnetic field sensor 3. This results in a monotonous relation between position of the flux shaper 1 and sensed field intensity, and no friction is present between the mutually moving first and second sensor parts.

FIG. 1 shows a cross sectional view of a first embodiment of the position sensor 10, mounted in a vacuum actuator 9, e.g. for controlling vanes in a turbo charger. The position sensor 10 includes an elongated axially symmetric member called a 'flux shaper' 1, which linearly moves along magnet axis 1a through an axially symmetric aperture 2a of the annular magnet 2. The position sensor 10 further includes a magnetic field sensor 3 mounted on a carrier 11, such as a printed circuit board (PCB) with electronic components for processing the signal from the magnetic field sensor 3. The magnetic field sensor 3 is positioned away from the annular magnetic member 2 at a fixed distance $1_1$ as measured along the longitudinal axis (magnet axis 1a) of the annular magnet 2. The annular magnet 2 may be chosen to be a permanent magnet but it could also be an electromagnet or any other element generating a suitable magnetic field. The magnetic field emanating from the annular magnet 2 passes through both the flux shaper 1 and the magnetic field sensor 3, and the spaces in between as will be discussed below.

The flux shaper 1 of the position sensor 10 is directly or indirectly moved by an actuator rod 5 or other moving part of the actuator in which the position sensor 10 is positioned. The actuator shown is a vacuum operated actuator having a housing 8, and a cup shaped actuator body 4 which is suspended to the actuator housing 8 using a bellows type of element 4a which allows a substantially linear movement of the actuator body 4 along the magnet axis 1a as shown. A resilient member 6 (e.g. a coil spring as shown) forces the actuator body 4 in a rest position against the actuator housing 8 (at the side of the actuator rod 5). The housing 8 is provided with a vacuum line connection 9a, which allows to move the actuator body 4 towards an actuated position by applying a vacuum to the vacuum space between housing 8, actuator body 4 and position sensor 10.

The actuator rod 5 is connected to the actuator body 4, e.g. using clamping rings 5a on both sides of the actuator body 4 as shown in the embodiment of FIG. 1, while maintaining the vacuum space. A bushing 7 is provided to guide the actuator rod 5 into the housing 8. The flux shaper 1 is connected to either the actuator rod 5 or to the actuator body 4, such that it provides the same movement along the magnet axis 1a of the position sensor 10. A connection of the flux shaper 1 to the actuator rod 5 can e.g. be provided using a screw connection.

In a specific embodiment, as shown in FIG. 1, the flux shaper 1 is an end part of an (external) actuator rod 5. In many actuator applications, the actuator rod 5 is made of soft magnetic material, and can be designed to function as the flux shaper 1 of the position sensor 10. In case of a vacuum actuator, of course, proper sealing of the moving actuator rod 5 to the housing 8 is provided.

When the actuator is designed to operate by exerting a force on the actuator rod 5 in a single direction (push rod version of actuator rod 5, e.g. when the actuator rod 5 itself is biased to return to a position in contact with the actuator), the actuator rod 5 can be simply in contact with the actuator body 4 without any further connection means. In this case the flux shaper 1 is firmly attached to actuator body 4, as e.g. in the embodiment shown in FIG. 3.

The annular magnet 2 and magnetic field sensor 3 are disposed in a sensor connector main part 13. The sensor connector main part 13 is attached to the actuator in a manner allowing to form the closed off vacuum space with the housing 8 and actuator body 4. In the embodiment shown, this is implemented using a housing rim 22 and associated sealing member 23, and possibly one or more securing parts of the housing 8.

The sensor connector main part 13 further comprises a (standardized) connector part 21 and one or more electrical leads 20, which are in contact with electronic components provided on the PCB 11.

FIG. 2 shows a number of dimensions playing a role in the functioning of the position sensor 10 according to some embodiments. As mentioned, the annular magnet 2 is positioned at a distance $1_1$ from the magnetic field sensor 3, and as shown in FIG. 2, (an end face of) the flux shaper 1 is at a second distance $1_2$ from the magnetic field sensor 3, the second distance $1_2$ varying over an operational range between a minimum distance and the first distance $1_1$. The annular magnet 2 is provided with an (axial) aperture 2a, and the inner diameter $d_1$ of the annular magnet 2 is larger than a maximum outer diameter $d_2$ of the flux shaper 1. The difference between inner diameter $d_1$ and maximum outer diameter $d_2$ is at least 1 mm, e.g. 3 mm.

Depending on the actual application and/or measurement requirements, the flux shaper 1 can have a varying diameter (e.g. a tapered geometry or a stepped geometry) along its operational length, where the operational length of the flux shaper 1 is defined to be the section of the flux shaper 1 that generally determines the measuring characteristics of the position sensor 10 (i.e. the part of flux shaper 1 that is actively influencing the magnetic field near the magnetic field sensor 3 during operation).

It is noted that not only the part of the flux shaper 1 extending in the space between annular magnet 2 and magnetic field sensor 3 influences the magnetic field, but also the part of the flux shaper positioned inside the aperture 2a of the annular magnet 2 and even the part of the flux shaper extending at the other end of the annular magnet 2 during operation. The structure and orientation of the flux shaper 1, annular magnet 2 and magnetic field sensor 3 as shown have as a technical effect that hysteresis in the B-H curve in the flux shaper 1 is compensated at the location of the magnetic field sensor 3.

The flux shaper 1 is designed as a substantially axially symmetric rod with an optimized radial geometry for maximum linearity. As further shown in the embodiment of FIG. 1, the flux shaper 1 moveably extends through the aperture 2a without touching an inner side of the annular magnetic member 2, thereby creating an air gap between the flux shaper 1 and the annular magnetic member 2. Although the flux shaper 1 is generally aligned in longitudinal fashion with the aperture 2a, an advantage of the present embodiment is that measurement accuracy is minimally influenced by any possible eccentricity and/or misalignment of the flux shaper 1 with respect to the aperture 2a.

For a person skilled in the art it is readily understood that the flux shaper 1 and annular magnetic member 2 are subject to manufacturing tolerances and/or temperature changes that introduce dimensional deviations. All conceivable embodiments of the flux shaper 1 and annular magnetic member 2 are geometrically designed to leave the air gap interposed in the presence of these dimensional deviations, thereby guaranteeing free and frictionless movement of the flux shaper 1 through the aperture 2a.

As further shown in the embodiments of FIGS. 1, 3 and 4 and discussed in further detail, the embodiment of the position sensor 10 comprises a magnetic field sensor 3 centrally positioned on the magnet axis 1a in the sensor connector main housing 13. The magnetic field sensor may be chosen to be a Hall sensor mounted on the printed circuit board 11, but any suitable magnetic field sensor would suffice for the present embodiments. The magnetic field emanating from the annular magnet 2 passes through the Hall sensor 3 and induces a voltage over its connecting terminals.

The flux shaper 1 is designed to influence the magnetic field emanating from the annular magnet 2. In an embodiment the flux shaper 1 is manufactured from a soft magnetic material (e.g. low carbon steel) such that it does not become permanently magnetized while being exposed to a magnetic field. Such material is readily available at low cost. The annular magnet 2 is e.g. made from a low cost magnetic material such as AlNiCo, instead of the more expensive Neodymium or Samarium Cobalt type of magnets. In a further embodiment, the annular magnet 2 is an electro magnet. This allows precise control of the flux induced in the position sensor 10.

Moving the flux shaper 1 towards the Hall sensor 3 decreases the magnetic flux passing through the Hall sensor 3 resulting in a lower voltage over its connecting terminals. Conversely, moving the flux shaper 1 away from the Hall sensor 3 increases the magnetic flux passing through the Hall sensor 3 resulting in a higher voltage over its connecting terminals. Hence, a particular position of the flux shaper 1 relative to the Hall sensor 3 directly correlates to a corresponding voltage over the connecting terminals of the Hall sensor 3. It should be noted that the flux shaper 1 never comes into contact with the Hall sensor 3, so that a permanent air gap is interposed between the flux shaper 1 and the Hall sensor 3 (with an air gap length $1_2$).

An important point to note is that the magnetic field sensor 3 does not measure the magnetic flux in the flux shaper 1 itself, but it measures a fraction of the magnetic flux emanating from the annular magnetic member 2. The flux shaper 1 influences the magnetic flux passing through the magnetic field sensor 3 when it moves closer to or away from the magnetic field sensor 3. As a result, the actual magnetic field strength within the flux shaper 1 is of no particular interest. Another point to note is that the flux shaper 1 is the only element in the position sensor 10 designed to purposefully manipulate the magnetic field emanating from the annular magnet 2 for sensing purposes.

Figure 5:
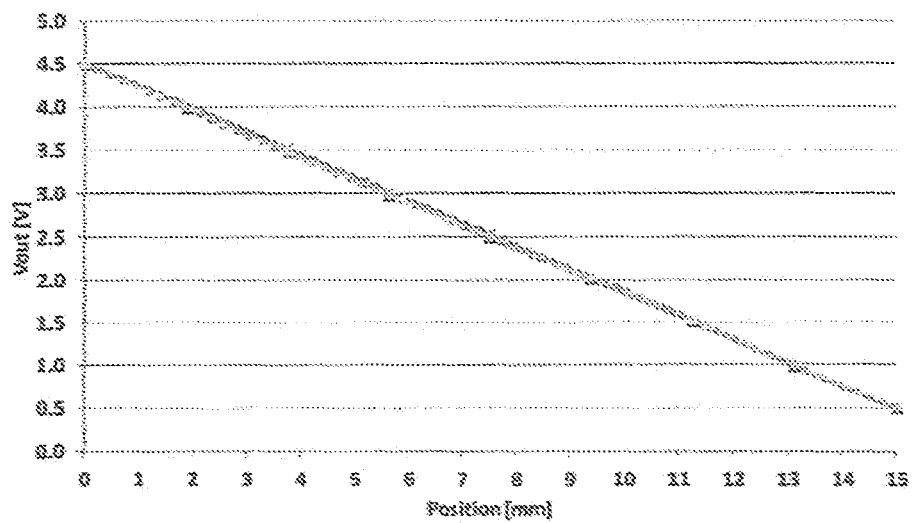
FIG. 5 shows a diagram of the output signal of a position sensor according to an embodiment as function of the linear position.

As mentioned in foregoing paragraphs, the flux shaper 1 can have a varying diameter along its operational length (e.g. a tapered geometry or a predetermined radial profile). The technical effect of a varying diameter lies in the relationship between the position of the flux shaper 1 and the magnetic field strength at the location of the Hall sensor 3. E.g. the magnetic field strength may be measured as a voltage over the connecting terminals of the Hall sensor 3. By providing the flux shaper 1 with a varying diameter over its operational length, a better linear relationship may be obtained between the position of the flux shaper 1 and the voltage over the connecting terminals of the Hall sensor 3. If needed any remaining non-linear behavior can be compensated with a dedicated electronic circuit which may be integrated on the same chip as the Hall sensor element. Having a nonlinear relationship could in theory be dealt with by suitable electronics placed on the printed circuit board 11, but the flux shaper 1 is purposefully designed to impose a generally linear relationship in order to reduce sensor complexity and manufacturing cost, thus making the position sensor better suited for mass production. In FIG. 5 an example is shown of a graph depicting relation of the magnetic field sensor 3 output signal as a function of measured distance of the flux shaper 1 (and hence linear position of the actuator), which clearly shows a very good linear relationship.

FIG. 3 shows a cross sectional view of a further embodiment of the position sensor 10. In this drawing, only the position sensor 10 is shown, without any further actuator parts with which to co-operate in actual operation.

In this embodiment, the position sensor 10 further includes a mounting disk 15 connected to a second end of the flux shaper 1 distal to the magnetic field sensor 3. The mounting disk 15 has a main surface which is substantially perpendicular to the sensing direction of the position sensor. This allows easy attachment of the flux shaper 1 (e.g. using a welding connection 16 as depicted in FIG. 3) to the mounting disk 15, and subsequently mounting the combination to a moving part of an actuator, such as the bottom surface of the actuator body 4 of the vacuum actuator shown in FIG. 1. Attachment can e.g. be accomplished using (point) welding, bolting or soldering techniques. In this embodiment, the coupling of actuator rod 5 (shown in FIG. 1) or in general an actuator element having a linear movement to actuator body 4 can be implemented using a coupling which allows some mutual movement in a direction different from the sensing direction (e.g. eccentric, torsional, etc.).

The embodiments shown in FIGS. 1, 3 and 4 are also provided with an optional magnetic shielding element 8A near the magnetic field sensor 3. The magnetic shielding element is made of soft magnetic material, and enhances the magnetic field of the position sensor 10 to be concentrated through the magnetic field sensor 3. In this particular embodiment the magnetic shielding element 8A has the form of a cup 8 extending over the entire space between annular magnet 2 and magnetic field sensor 3, also in circumferential direction. This also provides for a (magnetic) shielding function, eliminating influence from other external magnetic fields for the position sensor 10, which e.g. in automotive applications are often present. Such a shielding element 8A also improves the signal gain and reduces signal noise of the position sensor 10, and the measurement accuracy is further improved. As discussed above, prior art position sensors using magnetic field for determining a linear position, have been made with high grade material for housing and housing elements, to guarantee a long service life and maintain tight manufacturing tolerances. The present embodiments can be made at much lower cost. The friction less construction of the first and second part of the position sensor 10 allow to make a low cost position sensor 10, e.g. using molding techniques to form the sensor housing main body 13 of the embodiment of FIG. 4. All elements of the first part of the position sensor 10 can be included in the molding process at the correct mutual position, effectively making the housing main body a single molded part, of a low cost plastic material (e.g. a material regularly used in automotive applications, eliminating the need of use of high grade, high strength plastic materials).

In an alternative arrangement, which is shown as part of the embodiment of FIGS. 1 and 3, two housing parts 12, 13 are used, which by themselves are single molded parts, which can be assembled together. The housing main body 13 is again arranged for holding the magnetic field sensor 3 (and associated PCB 11, and optional shielding element 8A), and also comprises the connector part 21 and associated wiring/leads 20 for connecting the position sensor 10. A secondary housing part 12 is arranged to hold the annular magnet 2, e.g. using extending parts and a ring for holding the annular magnet 2 in place. The secondary housing part 12 fits into a space provided by the housing main body 13, and can be attached using one or more friction bolts 14 as shown. This embodiment is thus easy to assemble using a serial process to add elements one at a time to form the position sensor 10.

Instead of having two housing parts as described in relation to the embodiments shown in FIGS. 1 and 3, FIG. 4 shows an embodiment of a housing main body 13 as a single molded part. In this embodiment, the housing main body 13 accommodates an annular magnet 2, a Hall sensor 3 mounted on a PCB 11, and a flat magnet shielding element 8A (in the form of a flat disc). Such an arrangement reduces the number of components and facilitates the assembly of the position sensor 10. Note that in this embodiment the PCB 11 is disposed below the Hall sensor 3 and mounted on the main body 13, thereby further facilitating the assembly of the position sensor. The housing rim 22 is located near the magnetic shielding element 8A such that a large portion of the body 13 is received inside an actuator housing 8 as depicted in FIG. 1. In this configuration, the flat magnetic shielding element 8A is sufficient to shield the Hall sensor 3 and PCB 11 from outside disturbances, provided the actuator housing 8 is made of a suitable material that strongly attenuates such disturbances.

Figure 6:
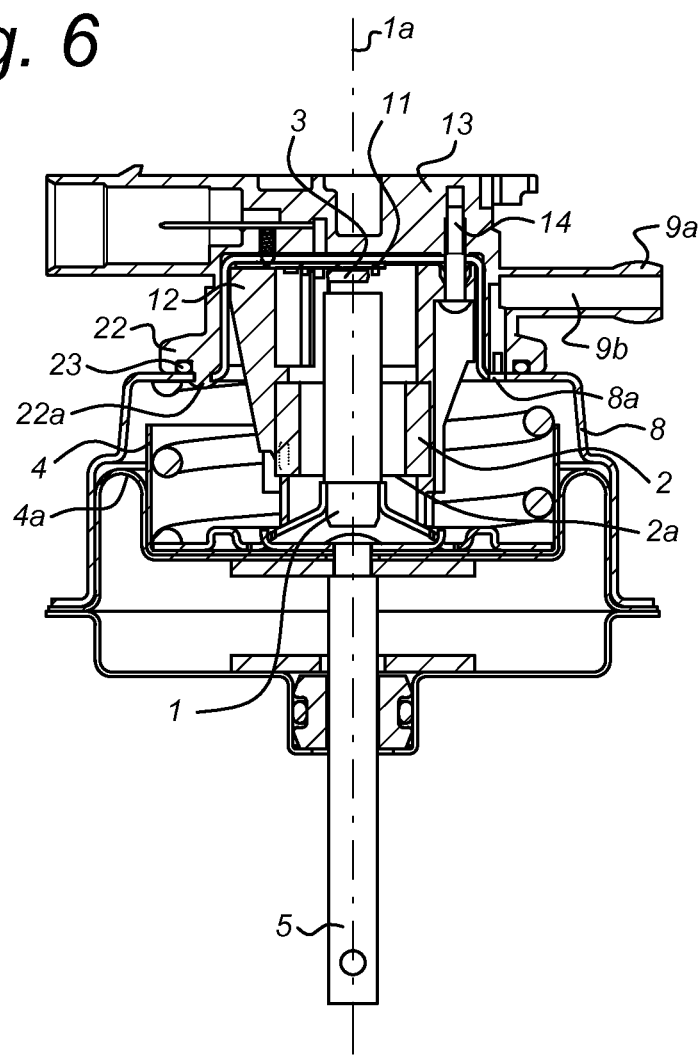
FIG. 6 shows a cross sectional view of an embodiment of a position sensor with integrated cover.

In an alternative embodiment shown in FIG. 6, the shielding function of the magnetic shielding element 8A can be further improved by providing a magnetic shielding element 8A and the actuator housing 8 as a single piece. That is, the position sensor 10 is now provided with an integrated cover including the magnetic shield element 8A and the actuator housing 8 as a single piece enclosure or housing. The integrated cover not only includes the space between the annular magnet 2 and the magnetic field sensor 3, but the integrated cover now extends well beyond the secondary housing element 12 and is connected to the bellows type element 4a. Comparable to the embodiments shown in e.g. FIGS. 1 and 3, the integrated cover is seen as a magnetic shielding element 8A having the form of a cup shaped element that shields a space between the annular magnet 2 and magnetic field sensor 3 in circumferential direction.

The integrated cover may be made of a metallic material for enhancing the magnetic field of the position sensor 10 to be concentrated through the magnetic field sensor 3. By manufacturing the magnetic shielding element 8A and the actuator housing 8 as a single piece, the number of components and associated manufacturing costs of the position sensor 10 are further reduced.

As with the magnetic shielding element 8A shown in FIG. 1, the integrated cover shields the magnetic field sensor 3 and the PCB 11 from outside disturbances, such as external magnetic fields. In this embodiment a larger volume of space inside the position sensor 10 is shielded from outside disturbances, so that the signal gain is increased and signal noise is reduced. The integrated cover therefore further optimizes the measurement accuracy of the position sensor 10.

In the embodiment shown, the vacuum line connection 9a is disposed on the connector main part 13 and includes a vacuum channel 9b aligned with a cover aperture 8a through which the position actuator 10 can be actuated. As the integrated cover 8 now lacks a vacuum line connection, it is easier to manufacture using a metallic material. A protruding vacuum line connection 9a is generally easier and cheaper to manufacture through an injection molding process of the connector main part 13 with an integrated vacuum line connection 9a.

The connector main part 13 further includes a housing rim 22 provided with a sealing member 23. The sealing member 23 ensures a gas tight connection of the connector main part 13 to the integrated cover 8. In an embodiment, one or more friction bolds 14 fixedly attach the connector main part 13 to the integrated cover 8. In a further embodiment, one or more housing rim stubs 22a fixedly attach the connector main part 13 to the integrated cover 8, wherein the one or more housing rim stubs 22a provide further pressure on the sealing member 23 for an improved sealing arrangement of the connector main part 13 and integrated cover 8. The one or more housing rim stubs 22a also ensure proper alignment of the cover aperture 8a and the vacuum channel 9b.

The sealing member 23 may be a circular O-ring substantially centered on the magnet axis 1a, wherein the cover aperture 8a and housing rim stubs 22a are positioned closer to the magnet axis 1a than the sealing member 23. That is, the sealing element 23 encloses the housing rim stubs 22a and the cover aperture 8a to prevent gas leakage between the housing rim 22 and integrated cover 8. In an alternative embodiment, the sealing member 23 may be a sealing glue disposed at the interface between the plastic and metallic parts of the sensor.

Figure 7:
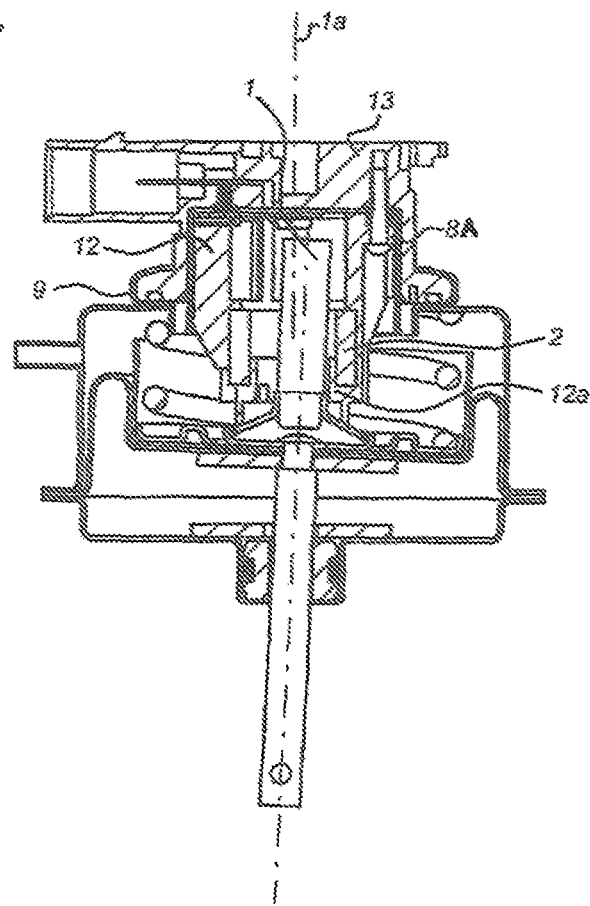
FIG. 7 shows a cross sectional view of an embodiment of a position sensor provided with an over travel stop.

FIG. 7 shows a cross sectional view of an embodiment of a position sensor 10 provided with an over travel stop, wherein the misalignment and eccentricity of the flux shaper 1 with respect to the magnet axis 1a is exaggerated and clearly visible. In this embodiment the position sensor 10 includes an annular over travel stop 12a disposed between the annular magnet 2 and the flux shaper 1. The annular over travel stop 12a is at least partially inserted into the annular magnet 2 covering at least partially an inner surface of said annular magnet 2.

The annular over travel stop 12a has an inner diameter larger than the maximum outer diameter d2 of the flux shaper 1 to ensure free movement of the flux shaper 1 through the annular over travel stop 12a. In an embodiment, the difference between the inner diameter of the annular over travel stop 12a and the maximum outer diameter d2 of the flux shaper is at least 1 mm, e.g. 2 mm.

In the embodiment shown, the flux shaper 1 is misaligned with respect to the magnet axis 1a, wherein the misalignment may comprise a linear and/or rotational offset with respect to the magnet axis 1a. Even though the air gap between the flux shaper 1 and annular magnet 2 is generally sufficient to prevent contact, the annular over travel stop 12a provides a precautionary measure for preventing any wear of the flux shaper 1 and/or annular magnet 2 as a result of sliding contact there between. The annular over travel stop 12a increases the useable lifespan and measurement accuracy of the position sensor 10 in case of excessive misalignment and/or eccentricity of the flux shaper 1 with respect to the magnet axis 1a.

In an embodiment, the annular over travel stop 12a is made of plastic material to prevent abrasion or scraping of the flux shaper 1 by the annular magnet 2, so that the original shape and magnetic properties of the flux shaper 1 remain unaffected in case the annular over travel stop 12a comes into contact with the flux shaper 1. The measurement accuracy of the position sensor 10 therefore remains unaffected should the flux shaper 1 come into contact with the annular over travel stop 12a.

Figure 8:
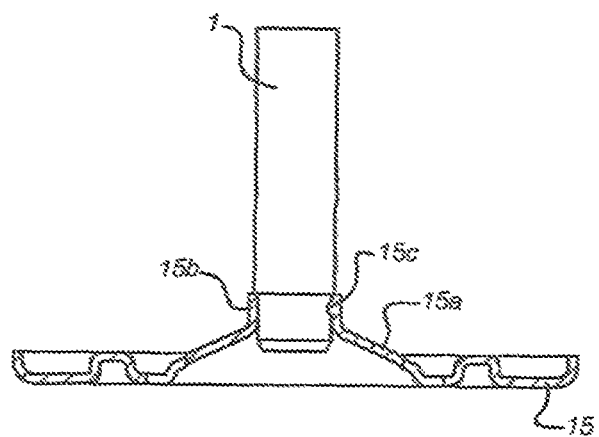
FIG. 8 shows a cross sectional view of an alternative embodiment of a flux shaper.

FIG. 8 shows an alternative embodiment of a flux shaper 1 and mounting disk 15. In this embodiment the mounting disk 15 includes a conical section 15a provided with a cylindrical end part 15*b*, the flux shaper 1 being firmly fixed in the cylindrical end part 15*b*. The cylindrical end part 15*b* allows for a strong and durable connection between the flux shaper 1 and mounting disk 15, wherein the connection is capable of withstanding cyclic loading without breaking due to fatigue.

For example, the position sensor 10 may be subjected to harsh vibrations in turbo machinery applications, which typically impose cyclic loads on the mounting disk 15 and flux shaper 1. The cylindrical end part 15*b* of the mounting disk 15 allows the flux shaper 1 to be firmly welded or clamped to the mounting disk 15, wherein connecting portions 15*c* (e.g. welded or clamped portions) of the cylindrical end part 15*b* do not absorb loading moments themselves but primarily prevent the flux shaper 1 from moving out of the cylindrical end part 15*c*, i.e. keeping the flux shaper 1 in place.

In the embodiment shown, the flux shaper 1 is further connected with the cylindrical end part 15*b* by means of an outer surface of the flux shaper 1 and an adjoining congruent inner surface of the cylindrical end part 15*b*. These surfaces substantially absorb loading moments imposed on the connection between the flux shaper 1 and mounting disk 15.

In an embodiment, the connecting portions 15*c* are clamped portions, wherein the cylindrical end part 15*b* is fixedly clamped to the flux shaper 1 by clamping or pressing the cylindrical end part 15*b* to the flux shaper 1. In an alternative embodiment, the connecting portions 15*c* are welded portions, wherein the cylindrical end part 15*b* is welded to the flux shaper 1. As mentioned earlier, the connecting portions 15*c* generally do not absorb loading moments but merely keep the flux shaper 1 in place, thereby preventing connection failure between the flux shaper 1 and the mounting disk 15 due to harsh vibrations often present in turbo machinery applications. To further increase structural connection, the connecting portions 15*c* may be present multiple times, e.g. as double welding portions, which is possible because of the overlapping height of the cylindrical end part 15*b* and the flux shaper 1. In an advantageous embodiment, the flux shaper 1 and mounting disk 15 are made from a single piece of metal using a low cost manufacturing technology such as deep-drawing.

Embodiments of the position sensor 10 disclosed herein have a number of advantages. Since there is no mechanical contact between the flux shaper 1 and the annular magnet 2, mechanical wear between these parts is eliminated and the use of expensive PPS plastics is avoided.

The present embodiments exemplify a position sensor that includes fewer parts and which is easier to manufacture without sacrificing reliability, measuring accuracy and robustness with respect to manufacturing tolerances and temperature variations. Compared to other currently available position sensors, the position sensor disclosed herein is particularly suitable for mass production due to its simplicity and low manufacturing cost.

The present invention embodiments have been described above with reference to a number of exemplary embodiments as shown in the drawings. Modifications and alternative implementations of some parts or elements are possible, and are included in the scope of protection as defined in the appended claims.

The invention claimed is:

1. A position sensor for determining a linear position in a sensing direction, comprising:
 a first sensor part and a second sensor part moveable with respect to each other,
 wherein the first sensor part comprises
  an annular magnet with its magnet axis coinciding with the sensing direction and generating a magnetic field with a distribution axially symmetric along the sensing direction, and
  a magnetic field sensor positioned at a first distance from the annular magnet on the magnet axis,
 wherein the second sensor part comprises a flux shaper moveable through the annular magnet along the sensing direction between a first and a second position, in the first position the flux shaper being substantially at the first distance from the magnetic field sensor, in the second position the flux shaper being substantially at a second distance from the magnetic field sensor,
 the flux shaper being arranged to influence the magnetic field in a space between the annular magnet and the magnetic field sensor.

2. The position sensor according to claim 1, wherein the annular magnet has an inner diameter d1 and the flux shaper has a maximum outer diameter d2, wherein the difference between inner diameter d1 and maximum outer diameter d2 is at least 1 mm.

3. The position sensor according to claim 1, wherein the flux shaper is an end part of an actuator rod.

4. The position sensor according to claim 1, further comprising a mounting disk connected to a second end of the flux shaper distal to the magnetic field sensor, the mounting disk comprising a main surface which is substantially perpendicular to the sensing direction.

5. The position sensor according to claim 1, further comprising a magnetic shielding element near the magnetic field sensor.

6. The position sensor according to claim 5, wherein the magnetic shielding element is a cup shaped element shielding a space between the annular magnet and magnetic field sensor in circumferential direction.

7. The position sensor according to claim 1, wherein said annular magnet is a permanent magnet.

8. The position sensor according to claim 1, wherein the annular magnet is an electromagnet.

9. The position sensor according to claim 1, wherein said flux shaper is manufactured from soft magnetic material.

10. The position sensor according to claim 1, wherein the flux shaper is an elongated rod with a predetermined radial profile.

11. The position sensor according to claim 10, wherein the predetermined radial profile comprises a stepped profile.

12. The position sensor according to claim 1, wherein the position sensor comprises a sensor housing formed as a single molded part.

13. The position sensor according to claim 1, wherein the position sensor comprises a sensor housing including a first part for mounting the magnetic field sensor and a second part for holding the annular magnet at the first distance from the magnetic field sensor.

14. An actuator for providing a linear movement to an actuator element, comprising a position sensor according to claim 1, wherein the second sensor part is connected to the actuator element.

15. An actuator according to claim 14, wherein the second sensor part is connected to the actuator element using a coupling allowing mutual movement in a direction different from the sensing direction.

16. The position sensor as in claim 7, wherein the permanent magnet comprises AlNiCo.

17. The position sensor as in claim 7, wherein the magnetic material comprises carbon steel.

\* \* \* \* \*